United States Patent
Yu et al.

(10) Patent No.: US 9,583,365 B2
(45) Date of Patent: Feb. 28, 2017

(54) METHOD OF FORMING INTERCONNECTS FOR THREE DIMENSIONAL INTEGRATED CIRCUIT

(75) Inventors: Chun Hui Yu, Zhubei (TW); Kuo-Chung Yee, Taoyuan (TW); Chen-Hua Yu, Hsin-Chu (TW); Yeong-Jyh Lin, Caotun Township (TW); Chia-Hsiang Lin, Zhubei (TW); Liang-Ju Yen, Zhubei (TW); Lawrence Chiang Sheu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1252 days.

(21) Appl. No.: 13/481,517

(22) Filed: May 25, 2012

(65) Prior Publication Data

US 2013/0313121 A1   Nov. 28, 2013

(51) Int. Cl.
*H01L 21/48* (2006.01)
*H01L 23/498* (2006.01)

(52) U.S. Cl.
CPC ...... *H01L 21/486* (2013.01); *H01L 23/49827* (2013.01); *H01L 23/49816* (2013.01); *H01L 2224/13099* (2013.01); *H01L 2224/16238* (2013.01); *H01L 2924/15311* (2013.01)

(58) Field of Classification Search
CPC .... C25D 5/02; C25D 7/12; C25D 7/00; H01L 2224/16238; H01L 2224/13099; H01L 23/49827; H01L 21/486; H01L 23/49816
USPC ............... 205/123, 122, 131; 257/778, 775; 438/638; 48/123, 122, 131
See application file for complete search history.

(56) References Cited

U.S. PATENT DOCUMENTS

| | | | |
|---|---|---|---|
| 3,616,195 A * | 10/1971 | Rendleman et al. | ......... 428/460 |
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,391,917 A | 2/1995 | Gilmour et al. | |
| 5,481,133 A | 1/1996 | Hsu | |

(Continued)

FOREIGN PATENT DOCUMENTS

| | | |
|---|---|---|
| DE | 10031204 A1 | 1/2002 |
| DE | 102007022959 A1 | 11/2008 |

OTHER PUBLICATIONS

Website: http://www2.ece.gatech.edu/research/labs/vc/theory/photolith.html.*

*Primary Examiner* — Louis Rufo
(74) *Attorney, Agent, or Firm* — Slater Matsil, LLP

(57) ABSTRACT

A method of forming interconnects for three dimensional integrated circuits comprises attaching a metal layer on a first carrier, attaching a first side of a packaging component on the metal layer, wherein the packaging component comprises a plurality of through vias. The method further comprises filling the plurality of through vias with a metal material using an electrochemical plating process, wherein the metal layer functions as an electrode for the electrochemical plating process, attaching a second carrier on a second side of the packaging component, detaching the first carrier from the packaging component, forming a photoresist layer on the metal layer, patterning the photoresist layer and detaching exposed portions of the metal layer.

18 Claims, 9 Drawing Sheets

(56) References Cited

U.S. PATENT DOCUMENTS

| | | | |
|---|---|---|---|
| 5,510,298 | A | 4/1996 | Redwine |
| 5,767,001 | A | 6/1998 | Bertagnolli et al. |
| 5,998,292 | A | 12/1999 | Black et al. |
| 6,002,177 | A | 12/1999 | Gaynes et al. |
| 6,184,060 | B1 | 2/2001 | Siniaguine |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,322,903 | B1 | 11/2001 | Siniaguine et al. |
| 6,355,501 | B1 | 3/2002 | Fung et al. |
| 6,434,016 | B2 | 8/2002 | Zeng et al. |
| 6,448,168 | B1 | 9/2002 | Rao et al. |
| 6,448,661 | B1 | 9/2002 | Kim et al. |
| 6,461,895 | B1 | 10/2002 | Liang et al. |
| 6,465,892 | B1 | 10/2002 | Suga |
| 6,472,293 | B1 | 10/2002 | Suga |
| 6,538,333 | B2 | 3/2003 | Kong |
| 6,562,653 | B1 | 5/2003 | Ma et al. |
| 6,570,248 | B1 | 5/2003 | Ahn et al. |
| 6,599,778 | B2 | 7/2003 | Pogge et al. |
| 6,600,222 | B1 | 7/2003 | Levardo |
| 6,607,938 | B2 | 8/2003 | Kwon et al. |
| 6,639,303 | B2 | 10/2003 | Siniaguine |
| 6,661,085 | B2 | 12/2003 | Kellar et al. |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,762,076 | B2 | 7/2004 | Kim et al. |
| 6,790,748 | B2 | 9/2004 | Kim et al. |
| 6,800,930 | B2 | 10/2004 | Jackson et al. |
| 6,838,310 | B1 * | 1/2005 | Hsuan .................. H01L 23/481 257/E23.011 |
| 6,841,883 | B1 * | 1/2005 | Farnworth ............ H01L 21/561 257/774 |
| 6,882,030 | B2 | 4/2005 | Siniaguine |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,962,867 | B2 | 11/2005 | Jackson et al. |
| 6,962,872 | B2 | 11/2005 | Chudzik et al. |
| 6,975,016 | B2 | 12/2005 | Kellar et al. |
| 7,030,481 | B2 | 4/2006 | Chudzik et al. |
| 7,037,804 | B2 | 5/2006 | Kellar et al. |
| 7,049,170 | B2 | 5/2006 | Savastiouk et al. |
| 7,056,807 | B2 | 6/2006 | Kellar et al. |
| 7,060,601 | B2 | 6/2006 | Savastiouk et al. |
| 7,071,546 | B2 | 7/2006 | Fey et al. |
| 7,087,538 | B2 | 8/2006 | Staines et al. |
| 7,111,149 | B2 | 9/2006 | Eilert |
| 7,122,912 | B2 | 10/2006 | Matsui |
| 7,151,009 | B2 | 12/2006 | Kim et al. |
| 7,157,787 | B2 | 1/2007 | Kim et al. |
| 7,193,308 | B2 | 3/2007 | Matsui |
| 7,215,033 | B2 | 5/2007 | Lee et al. |
| 7,262,495 | B2 | 8/2007 | Chen et al. |
| 7,276,799 | B2 | 10/2007 | Lee et al. |
| 7,279,795 | B2 | 10/2007 | Periaman et al. |
| 7,297,574 | B2 | 11/2007 | Thomas et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,335,972 | B2 | 2/2008 | Chanchani |
| 7,345,350 | B2 | 3/2008 | Sinha |
| 7,355,273 | B2 | 4/2008 | Jackson et al. |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,663,206 | B2 * | 2/2010 | Lee ................................ 257/532 |
| 7,678,685 | B2 * | 3/2010 | Sunohara et al. ............ 438/624 |
| 7,834,450 | B2 | 11/2010 | Kang |
| 7,850,836 | B2 * | 12/2010 | Dixit ........................ C25D 7/04 205/103 |
| 7,863,524 | B2 * | 1/2011 | Shioga .................. H05K 1/162 174/260 |
| 2005/0161833 | A1 * | 7/2005 | Takeuchi et al. ............. 257/775 |
| 2006/0060981 | A1 | 3/2006 | Paulus |
| 2009/0280602 | A1 | 11/2009 | Bonifield et al. |
| 2010/0159643 | A1 | 6/2010 | Takahashi et al. |
| 2011/0115082 | A1 | 5/2011 | Gluschenkov et al. |
| 2011/0183464 | A1 | 7/2011 | Takahashi et al. |
| 2011/0254161 | A1 * | 10/2011 | Hu ................................ 257/738 |

* cited by examiner

METHOD OF FORMING INTERCONNECTS FOR THREE DIMENSIONAL INTEGRATED CIRCUIT

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three dimensional integrated circuits have emerged as an effective alternative to further reduce the physical size of a semiconductor chip. In a three dimensional integrated circuit, active circuits such as logic, memory, processor circuits and the like are fabricated on different wafers and each wafer die is stacked on top of a packaging component using pick-and-place techniques. Much higher density can be achieved by employing three dimensional integrated circuits. In sum, three dimensional integrated circuits can achieve smaller form factors, cost-effectiveness, increased performance and lower power consumption.

A three dimensional integrated circuit may comprise an integrated circuit die, an interposer and a package substrate. More particularly, the integrated circuit die is attached to a first side of the interposer through a plurality of solder bumps. Solder bumps are used to provide electrical connection between the integrated circuit die and the interposer. A second side of the interposer is attached to the package substrate by a plurality of interconnect bumps. Interconnect bumps such as solder balls may provide electrical connection between the interposer and the package substrate, which in turn makes electrical connection to a printed circuit board through a plurality of package leads.

In order to reduce the potential solder failure between the integrated circuit die and the package substrate caused by thermal stresses, the interposer is employed to provide a matching coefficient of thermal expansion to the integrated circuit die. The interposer also provides adaptation between smaller contact pads with reduced pitch on an integrated circuit die and larger contact pads with increased pitch on a package substrate. In addition, the interposer may further comprise a variety of circuit elements. These circuit elements may be active, passive, or a combination of active and passive elements.

Three dimensional integrated circuits have some advantages. One advantageous feature of packaging multiple semiconductor dies vertically is that three dimensional package techniques may reduce fabrication costs. Another advantageous feature of three dimensional semiconductor devices is that parasitic losses are reduced by employing various interconnect bumps.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a three dimensional integrated circuit. The embodiments of the disclosure may also be applied, however, to a variety of semiconductor devices. Hereinafter, various embodiments will be explained in detail with reference to the accompanying drawings.

Figure 1:
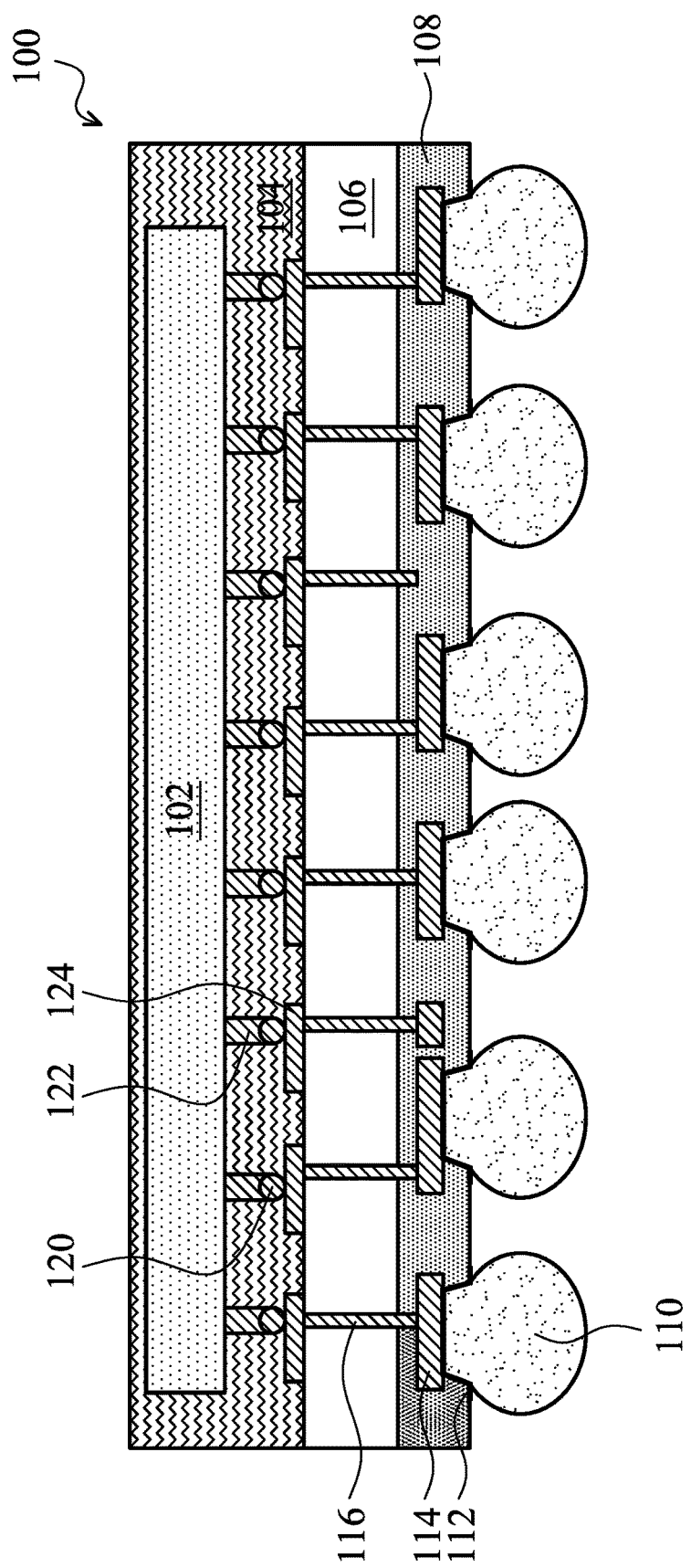
FIG. 1 illustrates a cross sectional view of a three dimensional integrated circuit in accordance with an embodiment.

FIG. 1 illustrates a cross sectional view of a three dimensional integrated circuit in accordance with an embodiment. A three dimensional integrated circuit 100 may comprise an integrated circuit die 102 stacked on a package component 106. As shown in FIG. 1, the integrated circuit die 102 is attached to a first side of the package component 106 through a plurality of interconnect components including metal pillar bumps 122, micro bumps 120 and redistribution layer 124. In addition, there may be an encapsulation layer 104 formed on top of the packaging component 106. In particular, the integrated circuit 102 and the interconnect components (e.g., micro bumps 120 and redistribution layer 124) are embedded in the encapsulation layer 104.

In accordance with an embodiment, the packaging component 106 may be an interposer. For simplicity, throughout the description, the packaging component 106 may be alternatively referred to as an interposer 106. The interposer 106 may be made of silicon, glass and/or the like. As shown in FIG. 1, the interposer 106 may comprise a plurality of vias 116 embedded in the interposer 106. The interposer 106 may further comprise a first side redistribution layer 124 formed on top of the first side of the interposer 106. After the integrated circuit die 102 is bonded on the interposer 106, the active circuits of the integrated circuit die 102 are coupled to the vias of the interposer 106 through a conductive channel formed by the redistribution layer 124, micro bumps 120 and the metal pillar bumps 122.

A second side of the interposer 106 may be attached to a package substrate (not shown) by a plurality of interconnect bumps 110. In accordance with an embodiment, these interconnect bumps 110 may be solder balls. As shown in FIG. 1, the redistribution layer 124 is connected to its corresponding through via 116. Furthermore, the through via 116 is connected to its corresponding interconnect bump 110 through a redistribution layer 114 and an under bump metallization structure 112. As such, the metal pillar bump 122, solder ball 120, the redistribution layer 124, the through via 116, the redistribution layer 114, the under bump metallization structure 112 and the interconnect bump 110 may form a conductive path between the active circuits of the integrated circuit die 102 and the package substrate (not shown), which in turn makes electrical connection to a printed circuit board or the like through a plurality of package leads.

Figure 2:
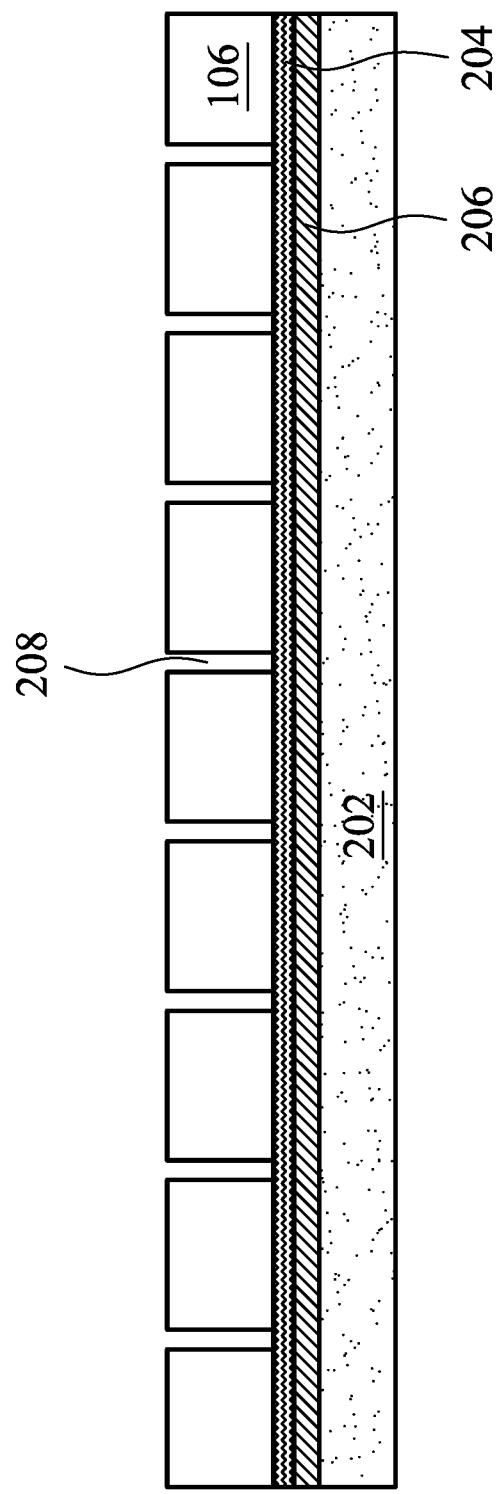
FIG. 2 illustrates a cross sectional view of placing an interposer on a first carrier in accordance with an embodiment.

FIGS. 2-9 are cross sectional views of intermediate stages in the making of redistribution layers and through vias in accordance with an embodiment. FIG. 2 illustrates a cross sectional view of placing an interposer on a first carrier in accordance with an embodiment. The first carrier 202 may be formed of a wide variety of materials comprising glass, silicon, ceramics and/or the like.

As shown in FIG. 2, a metal layer 206 is temporarily attached to the first carrier 202. In accordance with an embodiment, the metal layer 206 may be a copper foil layer. Alternatively, the metal layer 206 may be other suitable conductive materials such as copper alloys, aluminum, tungsten, silver and combinations thereof. Throughout the description, for simplicity, the metal layer 206 is alternatively referred to as a copper foil layer 206. The copper foil layer 206 is mounted on the carrier 202. In particular, the copper foil layer 206 may be glued on top of the first carrier 202 by employing a first adhesive layer (not shown). In accordance with an embodiment, the first adhesive layer may be formed of epoxy and/or the like.

A dielectric layer 204 is formed on top of the copper foil layer 206. The dielectric layer 204 may be formed of either photoresist materials or non-photoresist materials. In accordance with an embodiment, the dielectric layer 204 may be formed of photoresist materials such as polybenzoxazole (PBO), SU-8 photo-sensitive epoxy, film type polymer materials and/or the like.

The interposer 106 may be formed of silicon, glass and the like. There may be a plurality of through holes 208 embedded in the interposer 106. In accordance with an embodiment, the interposer 106 is of a thickness in a range from about 50 um to about 800 um. The interposer 106 is mounted on the first carrier 202. In particular, the interposer 106 may be glued on top of the copper coil layer 206 by employing the dielectric layer 204.

Figure 3:
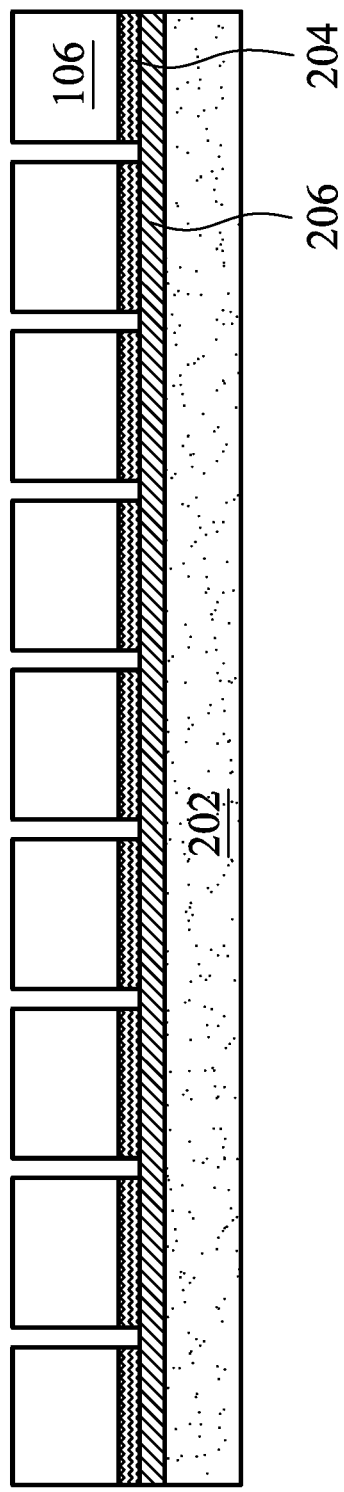
FIG. 3 illustrates a cross sectional view of the semiconductor device shown in FIG. 2 after the dielectric layer has been removed in accordance with an embodiment.

FIG. 3 illustrates a cross sectional view of the semiconductor device shown in FIG. 2 after the dielectric layer has been removed in accordance with an embodiment. The exposed portions of the dielectric layer shown in FIG. 2 may be removed by using suitable techniques such as chemical developing, laser ablation, dry etching and/or the like. The removal techniques are well known and hence are not discussed in further detail herein to avoid repetition.

Figure 4:
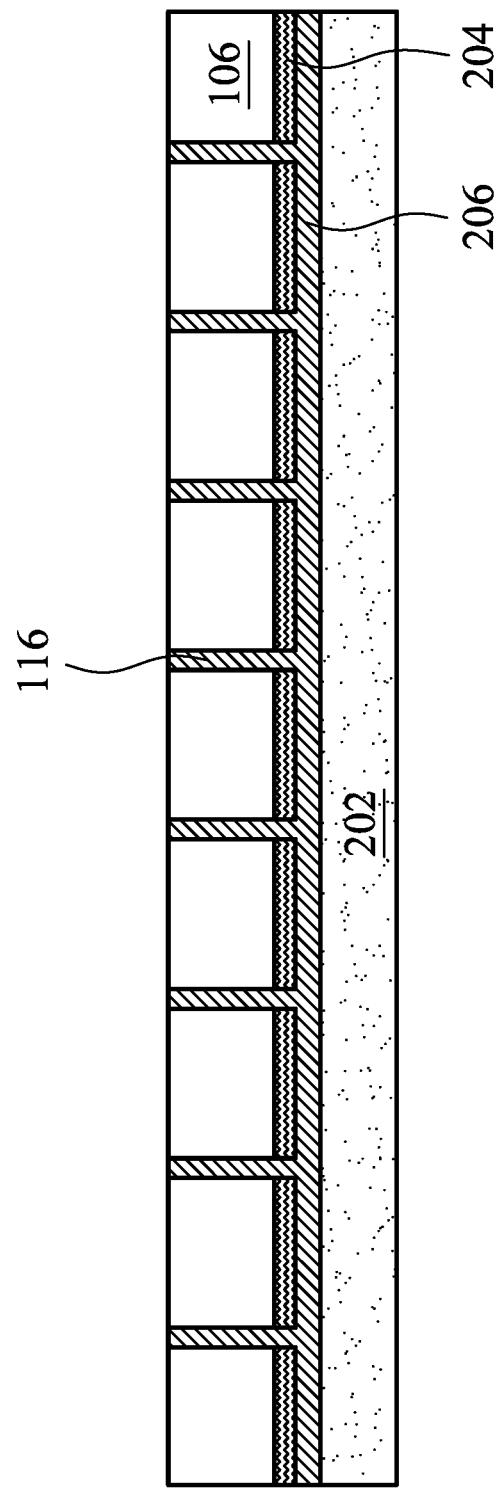
FIG. 4 illustrates a cross sectional view of the semiconductor device shown in FIG. 3 after a plurality of through vias are formed in the interposer in accordance with an embodiment.

FIG. 4 illustrates a cross sectional view of the semiconductor device shown in FIG. 3 after a plurality of through vias are formed in the interposer 106 in accordance with an embodiment. As shown in FIG. 4, an electrochemical plating process may be performed on the interposer 106 so that a conductive material fills the through holes (e.g., through hole 208 shown in FIG. 2) to form a plurality of through vias 116. The conductive material may be copper, but can be any suitable conductive materials, such as copper alloys, aluminum, tungsten, silver and combinations thereof. In a subsequent electrochemical plating process of forming through vias, the copper foil layer 206 may function as an electrode to facilitate the electrochemical deposition process.

In a conventional through silicon via (TSV) fabrication process, the fabrication steps may include depositing a seed layer, plating conductive materials on the seed layer, applying a chemical mechanical polishing (CMP) process and performing a thinning process to expose through vias. The method described above with respect to FIG. 4 does not require a seed layer. Instead, a bottom-up electrochemical plating process is performed on the copper foil layer (e.g., copper foil layer 206). One advantageous feature of having a bottom-up electrochemical plating process is that the bottom-up electrochemical plating process can prevent some manufacture defects such as voids trapped in through vias, which may deteriorate the overall reliability of a three dimensional integrated circuit. In addition, applying the bottom-up electrochemical plating process on the copper foil layer without requiring a seed layer may reduce operating costs and improve efficiency. Furthermore, the bottom-up electrochemical plating process can provide additional benefits such as deposition processes insensitive to sidewall surface roughness and less limitations on the aspect ratio of through vias.

Figure 5:
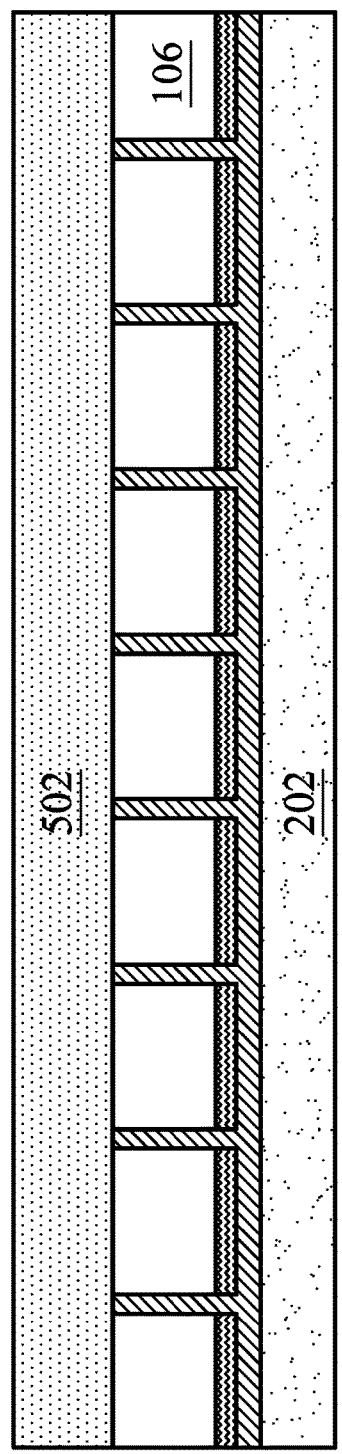
FIG. 5 illustrates a cross sectional view of the semiconductor device shown in FIG. 4 after a second carrier is mounted on top of the interposer in accordance with an embodiment.

FIG. 5 illustrates a cross sectional view of the semiconductor device shown in FIG. 4 after a second carrier 502 is mounted on top of the interposer 106 in accordance with an embodiment. The second carrier 502 is similar to the first carrier 202, and hence is not discussed in further detail. There may be a second adhesive layer (not shown) between the second carrier 502 and the interposer 106. In accordance with an embodiment, the second adhesive layer is formed of epoxy and/or the like.

Figure 6:
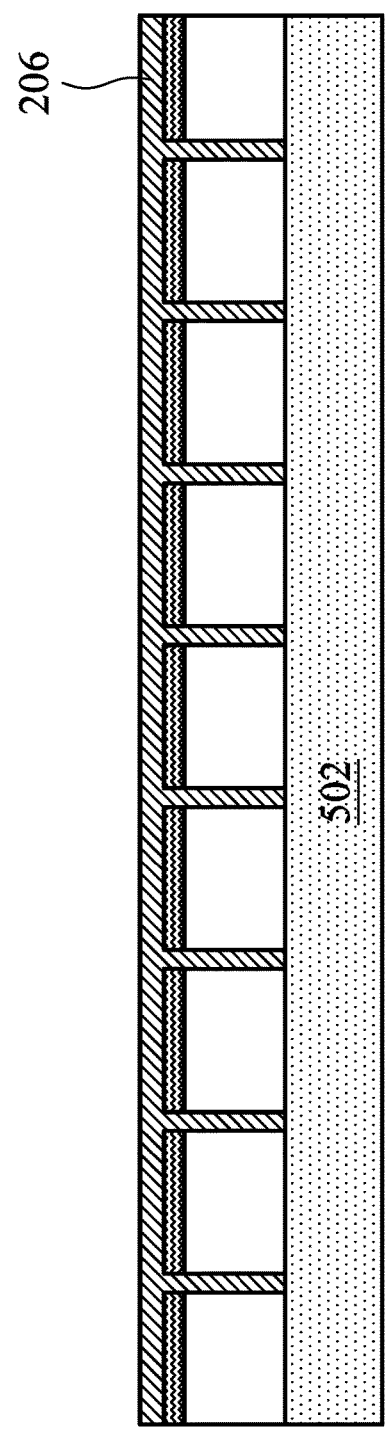
FIG. 6 illustrates a process of removing the first carrier from the semiconductor device shown in FIG. 5.

FIG. 6 illustrates a process of removing the first carrier from the semiconductor device shown in FIG. 5. In accordance with an embodiment, the first carrier 202 can be detached from the interposer 106. A variety of detaching processes may be employed to separate the interposer 106 from the first carrier 202. The variety of detaching processes may comprise a chemical solvent, a UV exposure and the like.

Figure 7:
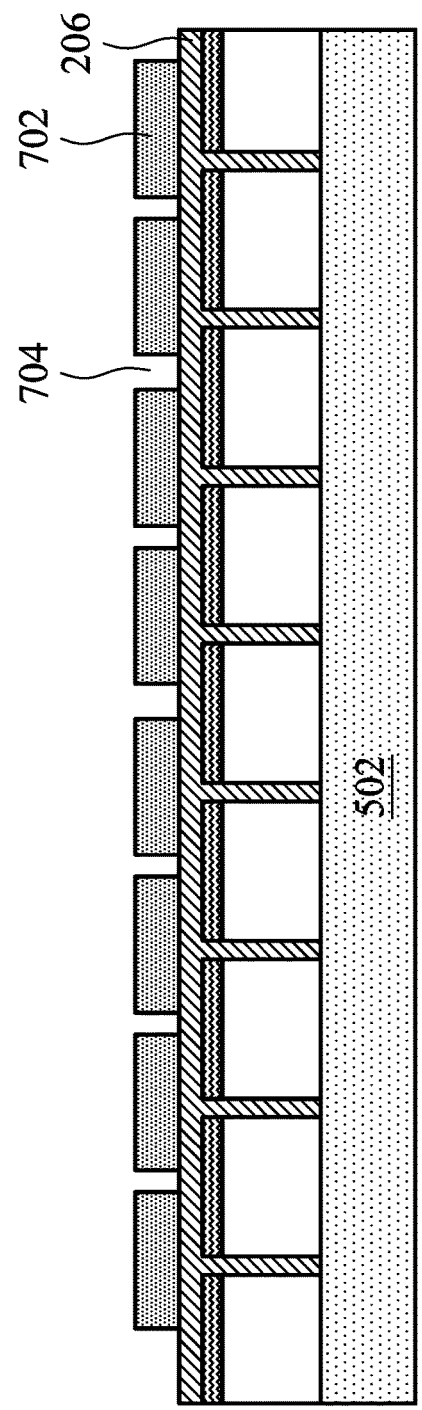
FIG. 7 illustrates a cross sectional view of forming a plurality of openings in a photoresist layer in accordance with an embodiment.

FIG. 7 illustrates a cross sectional view of forming a plurality of openings in a photoresist layer in accordance with an embodiment. A photoresist layer 702 is formed on top of the copper foil layer 206 over the interposer 106. The photoresist material may comprise SU-8 photo-sensitive epoxy, film type polymer materials and/or the like. In consideration of electrical and thermal needs, selective areas of the photoresist layer 702 are exposed to light. As a result, a variety of openings (e.g., opening 704) are formed. The formation of the openings such as opening 704 in the photoresist layer 702 involves lithography operations, which are well known, and hence are not discussed in further detail herein.

Figure 8:
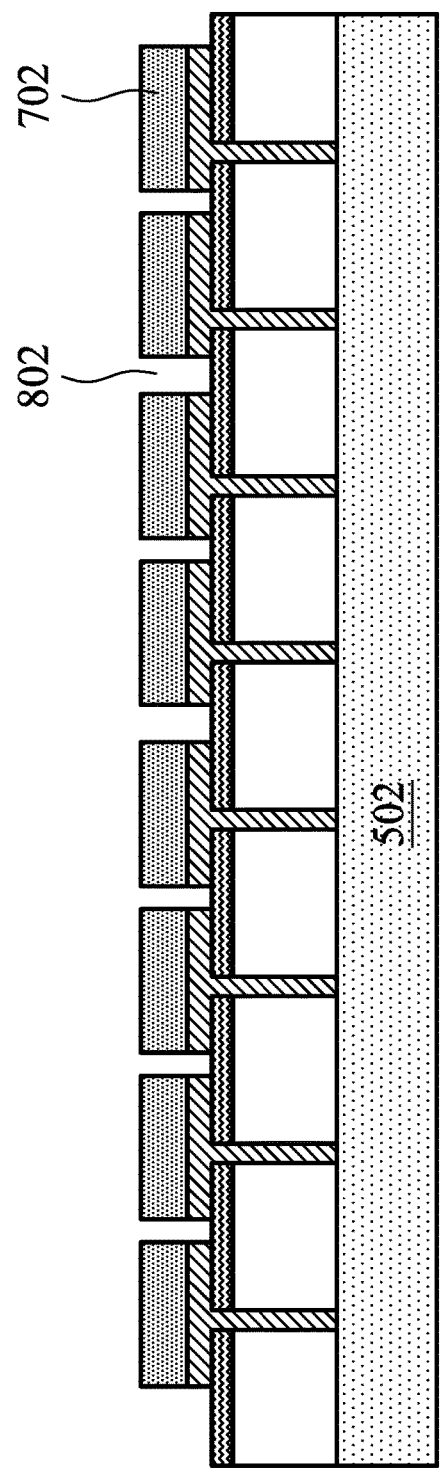
FIG. 8 illustrates a cross sectional view of the semiconductor device shown in FIG. 7 after the exposed portions of the copper foil layer have been removed.

FIG. 8 illustrates a cross sectional view of the semiconductor device shown in FIG. 7 after the exposed portions of the copper foil layer have been removed. In accordance with an embodiment, a suitable etching process such as wet-etching, dry-etching or the like may be applied to the exposed portions of the copper foil layer 206 shown in FIG. 7. As a result, the exposed portions of the copper foil layer 206 have been removed. The detailed operations of either the dry etching process or the wet etching process are well known, and hence are not discussed herein to avoid repetition.

Figure 9:
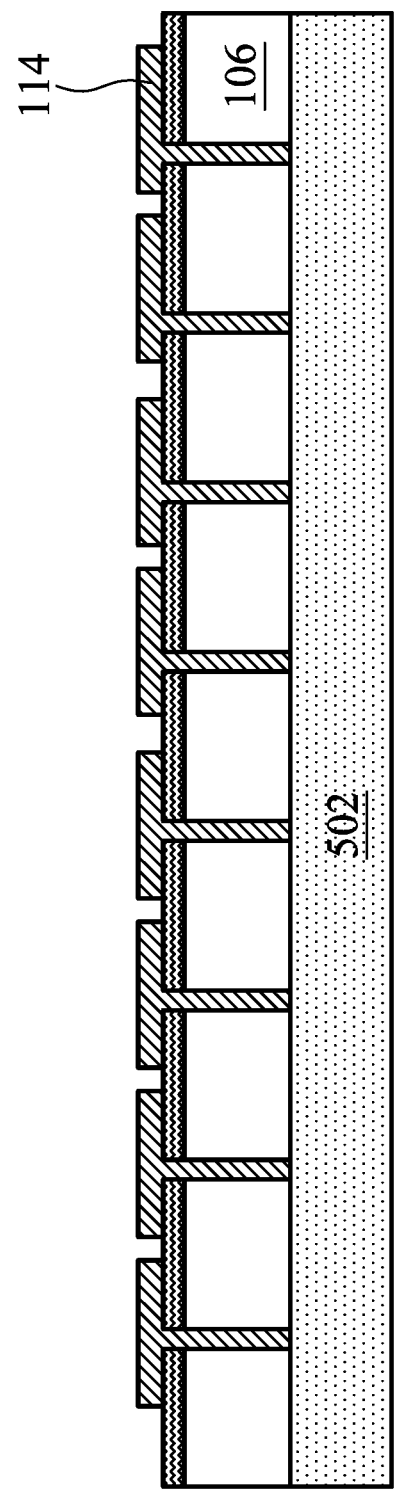
FIG. 9 illustrates a cross sectional view of the semiconductor device shown in FIG. 8 after the photoresist layer has been removed in accordance with an embodiment.

FIG. 9 illustrates a cross sectional view of the semiconductor device shown in FIG. 8 after the photoresist layer has been removed in accordance with an embodiment. The remaining photoresist layer 702 shown in FIG. 8 may be removed by using suitable photoresist stripping techniques such as chemical solvent cleaning, plasma ashing, dry stripping and/or the like. The photoresist stripping techniques are well known and hence are not discussed in further detail herein to avoid repetition.

It should be recognized that while FIG. 9 illustrates the interposer 106 with a single redistribution layer (e.g., redistribution layer 114), the interposer 106 could accommodate any number of redistribution layers. The number of redistribution layers illustrated herein is limited solely for the purpose of clearly illustrating the inventive aspects of the various embodiments. The present disclosure is not limited to any specific number of redistribution layers.

One advantageous feature of forming a redistribution layer based upon a copper foil layer is that the redistribution layer can be obtained by an etching process without depositing a seed layer and applying an electrochemical plating process. Such a copper foil based redistribution layer helps to reduce operating costs and improve efficiency.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
attaching a metal layer on a first carrier;
forming a dielectric layer on the metal layer;
attaching a first side of a packaging component on a first side of the dielectric layer, wherein the packaging component comprises a plurality of through holes before the packaging component is attached to the metal layer, and wherein the dielectric layer is between and in direct contact with the package component and the metal layer;
removing exposed portions of the dielectric layer to expose the metal layer;
filling the plurality of through holes with a metal material using an electrochemical plating process, wherein the exposed metal layer is employed as an electrode for the electrochemical plating process;
attaching a second carrier on a second side of the packaging component;
detaching the first carrier from the packaging component; and
patterning the metal layer to form a redistribution layer on the first side of the packaging component and expose a portion of a second side of the dielectric layer, wherein the plurality of through holes extend through the dielectric layer during the step of patterning the metal layer.

2. The method of claim 1, wherein:
the dielectric layer is a first adhesive layer.

3. The method of claim 1, wherein the packaging component is an interposer.

4. The method of claim 1, wherein the metal layer is a copper foil layer.

5. The method of claim 1, wherein the dielectric layer is a polymer adhesive layer.

6. A method comprising:
attaching a metal foil layer on a first carrier;
forming a dielectric layer on the metal foil layer;
attaching a first side of a packaging component on the metal foil layer, wherein, prior to the step of attaching the first side of the packaging component on the metal foil layer, the packaging component comprises a plurality of through holes, and wherein the dielectric layer is between and in direct contact with the package component and the metal foil layer;
removing exposed portions of the dielectric layer to expose the metal foil layer;
applying an electrochemical plating process to the packaging component such that a metal material fills the plurality of through holes to form a plurality of through vias, wherein the exposed metal foil layer is employed as an electrode for the electrochemical plating process; and
patterning the metal foil layer to expose the dielectric layer.

7. The method of claim 6, further comprising:
attaching a second carrier on a second side of the packaging component; and
detaching the first carrier from the packaging component.

8. The method of claim 6, further comprising:
forming a photoresist layer on the metal foil layer;
patterning the photoresist layer;
etching exposed portions of the metal foil layer to form a redistribution layer; and
removing remaining portions of the photoresist layer using a photoresist stripping process.

9. The method of claim 6, wherein:
the metal foil layer is formed of copper;
the packaging component is an interposer; and
the metal material is copper.

10. The method of claim 9, wherein the interposer is of a thickness in a range from about 50 um to about 800 um.

11. The method of claim 6, wherein the packaging component is a semiconductor die.

12. The method of claim 6, wherein the packaging component is a package substrate.

13. A method comprising:
forming a redistribution layer on a first side of a packaging component comprising:
attaching a metal layer on a first carrier;

attaching the first side of a packaging component on the metal layer, wherein the packaging component comprises a plurality of through holes;

filling the plurality of through holes with a metal material using an electrochemical plating process, wherein the metal layer is employed as an electrode for the electrochemical plating process;

attaching a second carrier on a second side of the packaging component;

detaching the first carrier from the packaging component;

forming a photoresist layer on the metal layer;

patterning the photoresist layer; and etching exposed portions of the metal layer to form the redistribution layer on the first side of the packaging component, wherein, during the step of etching exposed portions of the metal layer, a dielectric layer is between and in direct contact with the redistribution layer and the packaging component, and wherein during the step of etching exposed portions of the metal layer, the plurality of through holes extend through the dielectric layer;

forming an under bump metallization structure on the redistribution layer; and forming an interconnect bump on the under bump metallization structure.

14. The method of claim 13, further comprising:

forming a second redistribution layer on the second side of the packaging component;

attaching a semiconductor die on the second side of packaging component through a plurality of micro interconnect bumps; and forming an encapsulation layer on the packaging component.

15. The method of claim 14, wherein the packaging component is an interposer.

16. The method of claim 15, wherein the interposer is of a thickness in a range from about 50 um to about 800 um.

17. The method of claim 16, wherein the semiconductor die is embedded in the encapsulation layer.

18. The method of claim 13, wherein the metal layer is a copper foil layer.

* * * * *